United States Patent
Lu et al.

(10) Patent No.: US 7,518,238 B2
(45) Date of Patent: Apr. 14, 2009

(54) MOUNTING FLEXIBLE CIRCUITS ONTO INTEGRATED CIRCUIT SUBSTRATES

(75) Inventors: Daoqiang Lu, Chandler, AZ (US); Henning Braunisch, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 133 days.

(21) Appl. No.: 11/292,893

(22) Filed: Dec. 2, 2005

(65) Prior Publication Data

US 2007/0126118 A1   Jun. 7, 2007

(51) Int. Cl.
*H01L 23/12* (2006.01)
*H01L 21/48* (2006.01)

(52) U.S. Cl. .............. 257/732; 257/E23.063; 257/E23.065; 257/E23.054; 257/E23.055; 257/702; 257/723; 257/724; 438/109

(58) Field of Classification Search ......... 257/732, 257/E23.063, E23.065, 702, 724, E23.054, 257/E23.055; 438/109
See application file for complete search history.

(56) References Cited

U.S. PATENT DOCUMENTS

| 5,220,198 | A | * | 6/1993 | Tsuji ...................... 257/731 |
| 5,548,223 | A | * | 8/1996 | Cole et al. .............. 324/754 |
| 6,797,891 | B1 | * | 9/2004 | Blair et al. ............. 174/268 |
| 7,109,575 | B2 | * | 9/2006 | Kang et al. ............ 257/685 |
| 7,165,898 | B2 | * | 1/2007 | Kato et al. ............... 385/92 |
| 2002/0060833 | A1 | * | 5/2002 | Yamaguchi ............ 359/245 |
| 2003/0222282 | A1 | * | 12/2003 | Fjelstad et al. ......... 257/200 |
| 2004/0086026 | A1 | * | 5/2004 | Miki et al. ............. 374/183 |
| 2006/0001163 | A1 | * | 1/2006 | Kolbehdari et al. .... 257/758 |
| 2006/0091507 | A1 | * | 5/2006 | Fjelstad et al. ......... 257/676 |
| 2006/0270304 | A1 | * | 11/2006 | Aita ....................... 445/25 |
| 2007/0030433 | A1 | * | 2/2007 | Kudo et al. ............. 349/149 |
| 2007/0224845 | A1 | * | 9/2007 | Becker et al. ........... 439/66 |

FOREIGN PATENT DOCUMENTS

JP   2001-119116   *   4/2001
JP   2004-118164   *   4/2004

OTHER PUBLICATIONS

Lu et al., U.S. Appl. No. 11/155,208, filed Jun. 16, 2005, entitled "Breakable Interconnects and Structures Formed Thereby".

* cited by examiner

*Primary Examiner*—Alexander O Williams
(74) *Attorney, Agent, or Firm*—Trop, Pruner & Hu, P.C.

(57) ABSTRACT

A substrate may receive an integrated circuit and a flex circuit on the same side in the same vertical direction. In addition, in some embodiments, a flex circuit adapter and the integrated circuit may be surface mounted in one operation.

12 Claims, 3 Drawing Sheets

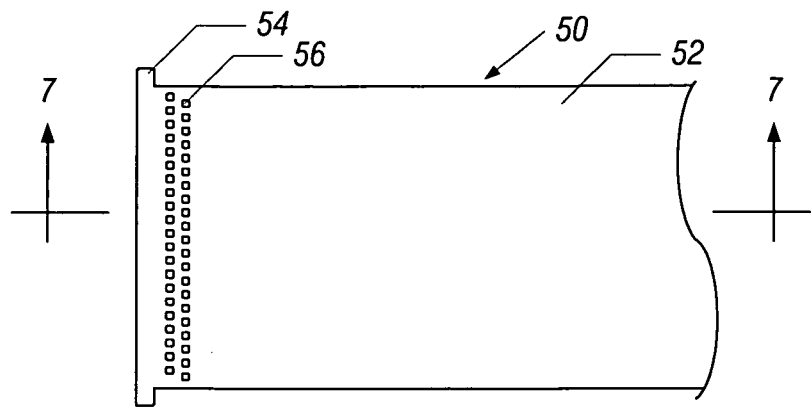
FIG. 6
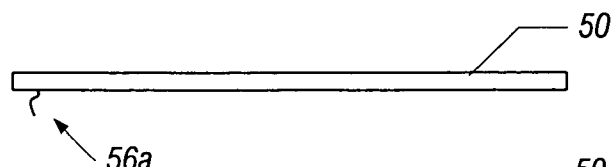
FIG. 7
FIG. 8
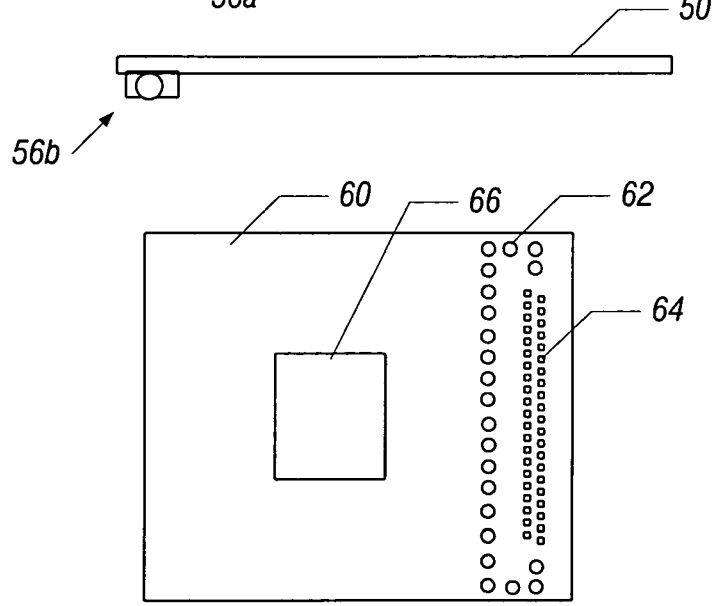
FIG. 9
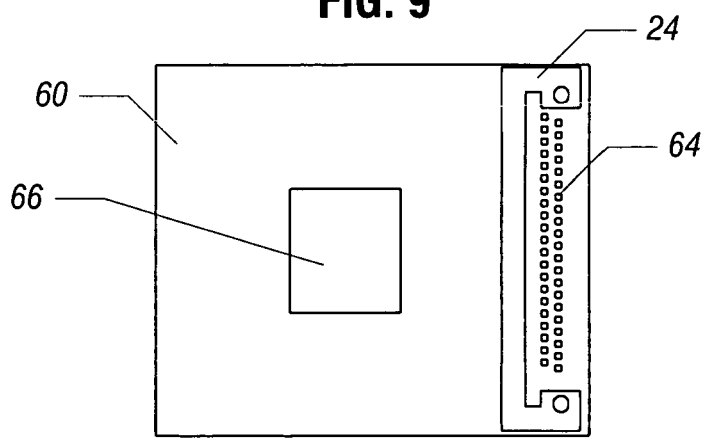
FIG. 10

US 7,518,238 B2

MOUNTING FLEXIBLE CIRCUITS ONTO INTEGRATED CIRCUIT SUBSTRATES

BACKGROUND

This invention relates generally to coupling flexible circuits to integrated circuits.

Flexible circuits, sometimes called flex circuits, or simply flex, may be utilized to flexibly convey electrical signals between two components. The flex may be formed of a polymer material with integrated conductors.

An integrated circuit may be mounted on a substrate. The substrate may have conductors within it in order to transfer electrical signals between the integrated circuit mounted on the substrate and a flex connecting to the substrate. Generally, existing flex interconnect schemes with such substrates involve lateral insertion of the flex into engagement with the substrate. By lateral insertion it is intended to refer to the motion in the direction parallel to the plane of the substrate. As a result, higher volume manufacturing is not feasible.

BRIEF DESCRIPTION OF THE DRAWINGS

FIG. 6 is a top plan view of one component of the embodiment shown in FIG. 1 in accordance with one embodiment of the present invention;

FIG. 7 is a cross-sectional view taken generally along the line 7-7 in FIG. 6 in one embodiment of the present invention;

FIG. 8 is a cross-sectional view taken generally along the line 7-7 in FIG. 6 in another embodiment of the present invention;

FIG. 9 is a top plan view of one component shown in FIG. 1 in accordance with one embodiment of the present invention with an integrated circuit on top of that component;

FIG. 10 is a top plan view of the embodiment in FIG. 9 with the component of FIG. 2 in place in accordance with one embodiment of the present invention;

DETAILED DESCRIPTION

Figure 1:
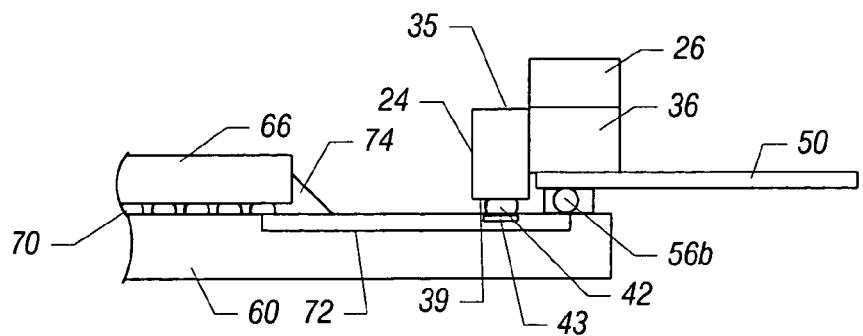
FIG. 1 is an enlarged, partial cross-sectional view of one embodiment of the present invention.

Referring to FIG. 1, a substrate 60 may be any conventional substrate for mounting integrated circuits. Examples of such substrates include build up layers, printed circuit boards, and package substrates. In one embodiment, the substrate 60 includes a buried integrated conductor 72. The conductor 72 may, for example, include two vertical vias coupled by a horizontal conductive layer. However, generally, a large number of such conductors may be provided within the substrate 60.

Mounted on the substrate 60 and in electrical communication with conductors 72 within the substrate 60 may be an integrated circuit 66. The integrated circuit 66 may be any conventional or non-conventional integrated circuit including a microprocessor. Different interconnection schemes may be utilized to couple conductors 72 to suitable contacts within the integrated circuit 66. In one embodiment, a flip chip technique may utilize solder balls 70, such that the solder balls 70 make electrical contact with conductors 72 within the substrate 60. An underfill encapsulant 74 may be used to seal the connection between the integrated circuit 66 and the substrate 60 and enhance the package reliability thermomechanically, in some embodiments.

Also coupled to the substrate 60 is a flex circuit 50. The flex circuit 50 may be formed of a polymeric material with integrated conductors (not shown). The conductors in the flex circuit 50 may make electrical contact to the conductors 72 within the substrate 60. In other words, the conductors 72 may couple electrically on one end to the integrated circuit 66 and on the other end to the flex circuit 50. Of course, on any given substrate 60, there may be a variety of integrated circuits 66 and a variety of flex circuits 50, which may be variously interconnected.

An electrical connection from the flex circuit 50 and its conductors (not shown) to the conductors 72 may be by way of a contact 56b in one embodiment. The contact 56b, in one embodiment, may be a mechanically compliant, electrically conductive sphere which is prefabricated onto the flex circuit 50. The sphere may be a polymeric sphere, coated with conductive material, and joined to other conductive spheres by a polymer film matrix, forming an anisotropic conducting film (ACF). However, any of a variety of other conductors and connectors may be utilized to directly couple the flex circuit 50 to the conductors 72. By directly connecting it is intended to refer to the fact that the flex circuit 50 has integrated or connected to it connectors or contacts 56b which immediately make contact with the conductors 72 when the flex circuit 50 is positioned appropriately on the substrate 60.

In one embodiment of the present invention, the ACF may be made of a polymer having the conductive spheres randomly dispersed therein. Thus, the polymer may be in the form of a film having a thickness greater than the diameter of the spheres. The spheres may have a spherical polymeric core covered by at least one layer of metal or other conductor. In one embodiment, an inner layer of nickel adheres to the polymeric sphere and a layer of gold is supplied around the nickel layer.

Thus, when heat and/or pressure are applied to the anisotropic conductive film, the spheres are extruded through the film so as to make contact on the top and bottom sides of the film. In some embodiments, a large number of the conductive spheres may be contained within the matrix defined by a polymer material.

The polymer matrix may be heated sufficiently to soften the polymer matrix surrounding the spheres and sufficient compressive force may be provided to extrude the spheres through the polymer matrix so as to make contact on either of two opposed sides of the polymer matrix.

The matrix may, for example, be epoxy, polyurethane, polystyrene copolymer, polyolefins, silicone, polyurethane, and epoxy silicone or combinations thereof, to mention a few examples. The polymeric sphere may be formed of epoxy, silicone, polyurethane, and combinations thereof, to mention a few examples. The conductive sphere may have a diameter between about 10 and 300 microns in one embodiment.

An adapter serves to hold the flex circuits 50 in appropriate electrical connection with the conductors 72, secured to the substrate 60. The adapter may include a mechanical joint 42, a U-shaped base 24, a spacer 36, and a cover 26 which holds the base 24 and spacer 36 in a constraining relationship with respect to the flex circuit 50. In other words, the adapter fixes the flex circuit 50 in position on the substrate 60. Thus, in some embodiments, the adapter enables the flex circuit 50 to be applied from above in a vertical direction. In some embodiments, the vertical application improves the manufacturability of the overall structure including the flex circuit 50. This is because automated assembly and testing can be used to assemble vertically applied elements such as the integrated circuit 66 and the adapter. For example, pick and place machines may be used.

In some embodiments, the adapter may be made sufficiently low profile so that there is no interference with any heat sink (not shown) used to remove heat from the integrated circuit 66. Thus, in some embodiments, the adapter, including the elements 24 and 36, may be made much thinner than what is depicted in FIG. 1, the relatively greater thickness being used for illustration purposes only.

Figure 2:
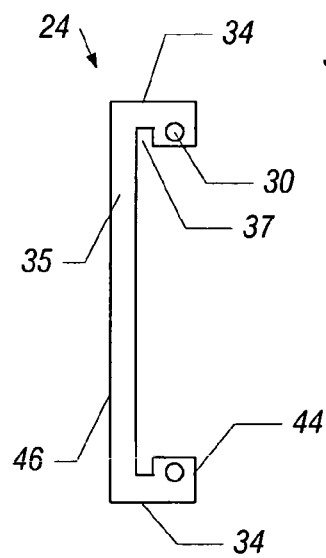
FIG. 2 is a top plan view of one component shown in FIG. 1 in accordance with one embodiment of the present invention.

Referring to FIG. 2, the base 24 may be U-shaped including a body 46 with a pair of transversely extending stubs 34 on each end. In one embodiment, each stub 34 is L-shaped, turning inwardly, as indicated in FIG. 2. Within the inwardly turned portion of each stub 34 is a screw or fastener hole 30 in some embodiments. Each of the stubs 34 has a surface 44 facing away from the body 46. In addition, in some embodiments, the base 24 has a relatively smooth upper surface 35. In some embodiments, the base 24 may be formed of relatively low cost, high rigidity plastics. The base 24 includes a notch 37 which serves, in some embodiments, to secure ears on a flex circuit, as will be described in more detail hereinafter.

Figure 3:
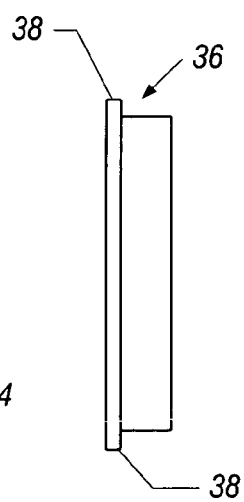
FIG. 3 is a top plan view of one component of the embodiment shown in FIG. 1 in accordance with one embodiment of the present invention.

Referring next to FIG. 3, the spacer 36 may be formed of a resilient or compliant material such as natural or synthetic rubbers. The spacer 36 includes ears 38 which may be engaged in the notches 37 within the base 24. In fact, the spacer 36 is arranged to be accurately engaged within an opening between the stubs 34 and the body 46 that includes the notches 37.

Figure 4:
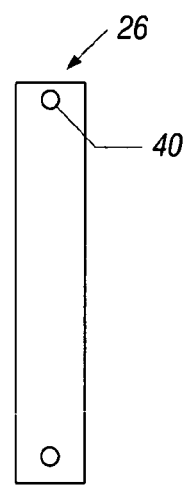
FIG. 4 is a top plan view of another component shown in FIG. 1 in accordance with one embodiment of the present invention.

Referring to FIG. 4, the cover 26 includes screw holes 40 which are arranged to mate with the screw holes 30 in the base 24 when the cover 26 is positioned over the base 24, as shown in FIG. 1. In one embodiment, the cover 26 may be made of relatively rigid material such as a metal including stainless steel.

Figure 5:
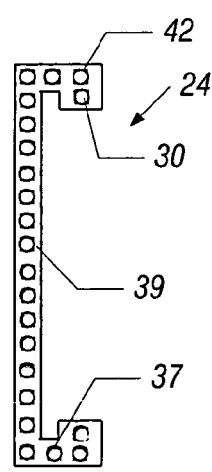
FIG. 5 is a bottom plan view of the component shown in FIG. 2 in accordance with one embodiment of the present invention.

Referring to FIG. 5, the bottom 39 of the base 24 may include a plurality of solder balls 42. In some embodiments, the solder balls perform no electrical function, but are merely provided for surface mount retention of the base 24 on the substrate 60, as indicated in FIG. 1 with the solder ball 42.

The solder balls self-align the adapter correctly on the substrate 66. The substrate 66 includes a pattern of lands 43. Through surface tension in the molten state during reflow, the solder balls 42 automatically align themselves on the lands 43. As a result, the adapter is correctly aligned on the substrate 60 via solder self-alignment upon the application of heat to attach the adapter to the substrate 60. For example, the adapter and the circuit 66 may be attached to the substrate 60 at the same time.

Referring to FIG. 6, the flex circuit 50 includes an extended body 52 coupled on an end (not shown) to some other source and/or sink of signals. The body 52 includes a plurality of electrical contacts 56 which, when the side shown in FIG. 6, is placed downwardly on a substrate 60, make electrical connections to the conductors 72 in the substrate 60. Also provided on the flex circuit 50 may be ears 54 which may be engaged within the notches 37 in the base 24.

Thus, as shown in FIG. 7, in one embodiment, the contact 56a, that electrically couples the flex circuit 50 to the substrate 60, may be a microspring contact integrally formed on or attached to the underside of the flex circuit 50. In another embodiment, a different contact 56b, shown in FIG. 8, may be utilized in the form of an ACF prefabricated onto the flex circuit 50. Other contacts 56 may be utilized as well to directly connect the flex circuit 50 to the substrate 60. In some embodiments, the contacts 56 may be formed on the substrate 60 instead of the flex circuit 50.

Referring next to FIG. 9, the substrate 60 may have positioned on top of it the integrated circuit 66 in the course of manufacturing. The substrate 60 may have preformed thereon a plurality of lands 62 that make mechanical connection to the solder balls 42 which may be preformed, in one embodiment, on the lower face 39 of the base 24. Also provided on the substrate 60 are a plurality of preformed lands 64 which are passive elements, in one embodiment, that make electrical connections to the contacts 56 preformed on the flex circuit 50. In other embodiments, the active contact portions may be preformed on the substrate 60 and the passive contacts or lands may be formed on the flex circuit 50.

Continuing with FIG. 10, in accordance with one embodiment of the present invention, the base 24 may be positioned on the substrate 60 using a pick and place machine. In some embodiments, fiducials are fabricated on the top surface of the substrate 60 and the bottom 39 of the base 24, and are used for vision recognition to align the lands 62 and solder balls 42 during the pick and place operation. A flux or solder paste is printed on the lands 62 before the picking and placing of the base 24. After the pick and place operation, the substrate 60 with the base 24 is sent through a reflow oven to melt the solder ball 42 and to attach the base 24 to substrate 60.

Figure 11:
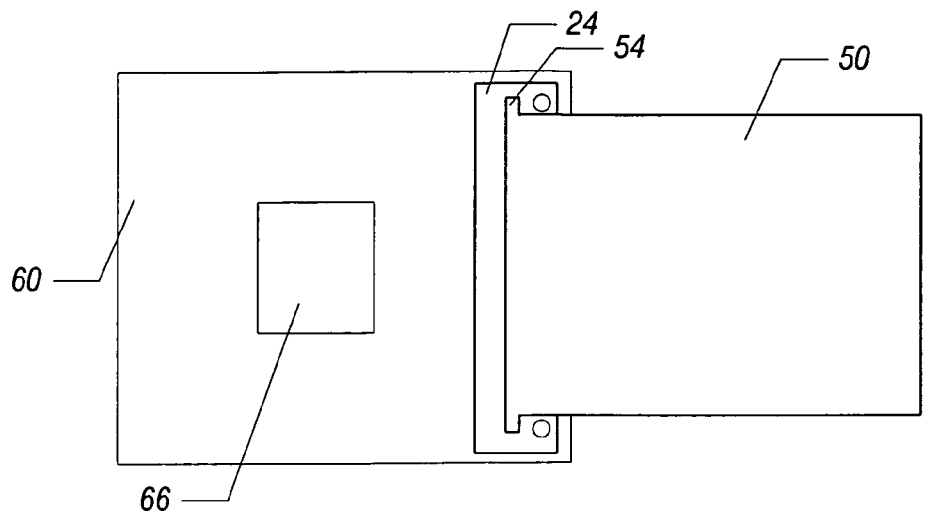
FIG. 11 is a top plan view corresponding to FIG. 10 with the component of FIG. 6 in place in accordance with one embodiment of the present invention.

In one embodiment, the integrated circuit 66 and the base 24 may be simultaneously attached to the substrate 60 in the same assembly step. In other words, the integrated circuit 66 and the base 24 are picked and placed, and then sent through a reflow oven together. After reflowing, both the integrated circuit 66 and the base 24 are attached on the substrate 60. Moving to FIG. 11, the flex circuit 50 may be engaged within the base 24 so that the ears 54 of the flex circuit 50 are engaged and held by the notches 37 in the base 24.

Figure 12:
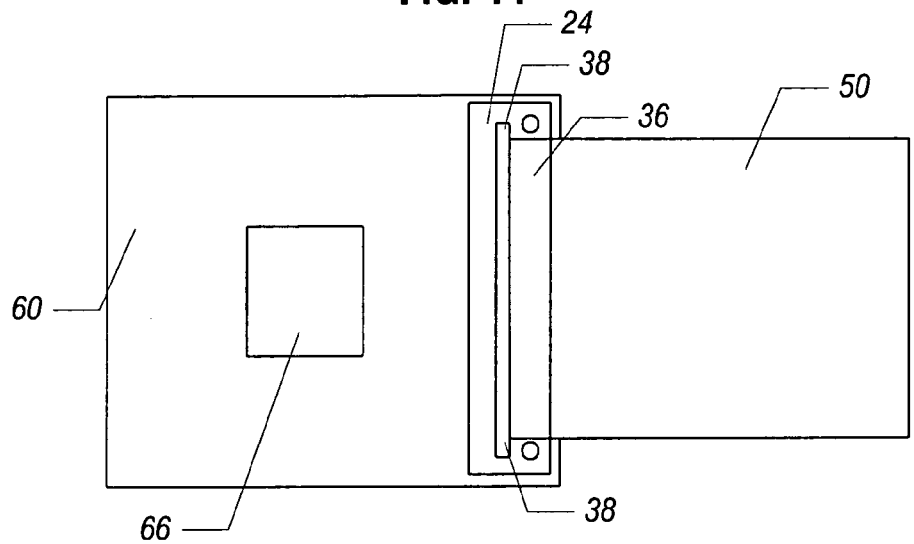
FIG. 12 is a top plan view corresponding to FIG. 11 with the component of FIG. 3 in place in accordance with one embodiment of the present invention.

Then, as shown in FIG. 12, the spacer 36 may be positioned over the flex circuit 50 and, likewise, secured within the base 24 through the ears 38 on the spacer 36 that are engaged within the notches 37 defined within the base 24.

Figure 13:
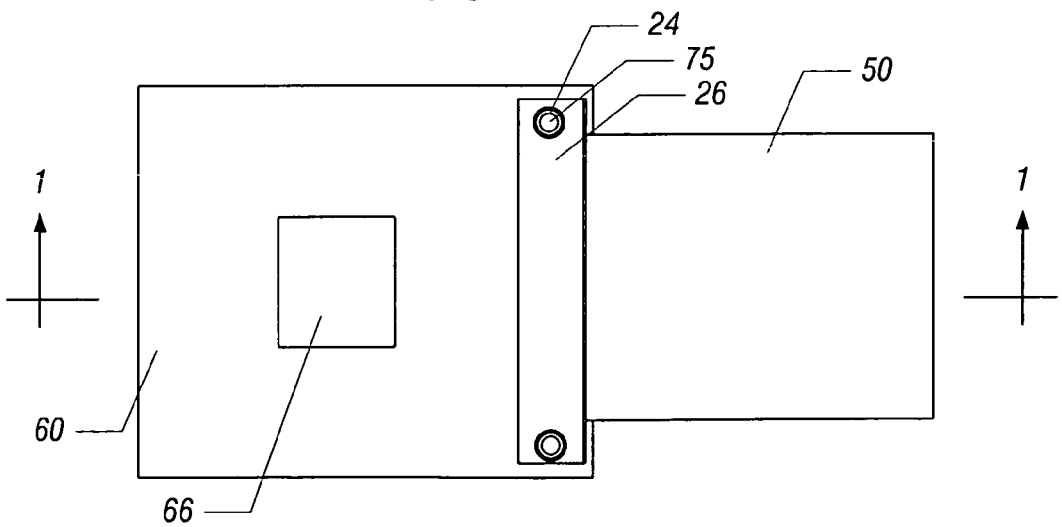
FIG. 13 is a top plan view of the embodiment of FIG. 12 with the component shown in FIG. 4 in place in accordance with one embodiment of the present invention and corresponding to the embodiment shown in FIG. 1.

Finally, as shown in FIG. 13, the cover 26 may be applied over the spacer 36. Then, screws 75 may be passed through the holes 40 in the cover down to the holes 30 in the base 24 for threaded engagement therewith in one embodiment. In other words, with the screws 75 in place, the cover 26 clamps the spacer 36 onto the flex circuit 50 and biases the flex circuit 50 against the substrate 60, making electrical connections between the contacts 56 on the flex circuit 50 and the conductor 72 on the substrate 60. For example, the cover 26 may stop when it is flush against the base 24. However, other means of securing the cover may be utilized as well, including rivet or snap connections, to mention a few examples.

In some embodiments of the present invention, the adapter may be made at relatively low cost and may be compatible with high volume manufacturing. Since the adapter may be secured to the substrate simultaneously with die attach, a quick and economical process may be achieved. Since the adapter mounts on top of the substrate 60, automated placement machines may be used. In such embodiments, no complicated motions may be needed for establishing the connection so that robotic testing of the assembled package may be facilitated. In addition, because the flex circuit 50 contacts the substrate 60 directly, in some embodiments, the adapter material may have a negligible impact on the electrical performance (such as high speed I/O performance) of the connections between the flex circuit 50 and the substrate 60. This may enable cost reduction via use of a cheaper material for the adapter as compared to the housing of some high speed connectors where the contacts are in intimate contact with the connector housing.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit device comprising:
a substrate;
an integrated circuit attached to said substrate;
an adapter surface mounted to said substrate to secure a flex circuit to said substrate, said surface including a T-shaped flex circuit receiving opening; and
a flex circuit secure within said opening.

2. The device of claim 1 wherein said adapter surface includes a base that is U-shaped.

3. The device of claim 1 wherein said flex circuit includes a T-shaped end.

4. The device of claim 3 wherein said flex circuit includes microspring contacts formed thereon.

5. The device of claim 3 wherein said flex circuit includes conductive polymeric spheres formed thereon.

6. The device of claim 1 including a conductor in said substrate electrically coupling said integrated circuit and said flex circuit.

7. The device of claim 1 wherein said adapter includes a U-shaped base having solder balls.

8. The device of claim 7 wherein said substrate includes lands on which said solder balls are secured.

9. the device of claim 8 wherein said adapter is aligned to said substrate by solder self-alignment.

10. An integrated circuit device comprising:
a substrate;
an integrated circuit attached to said substrate;
an adapter surface mounted to said substrate to secure a flex circuit to said substrate, said surface including a T-shaped flex circuit receiving opening; and
a conductor and said substrate electrically coupling said integrated circuit and said flex circuit.

11. The device of claim 10 wherein said substrate includes lands on which said solder balls are secured.

12. The device of claim 11 wherein said adapter is aligned to said substrate by solder self-alignment.

* * * * *